(12) United States Patent
Yagi et al.

(10) Patent No.: US 6,566,422 B1
(45) Date of Patent: May 20, 2003

(54) CONNECTING MATERIAL

(75) Inventors: Hidekazu Yagi, Kanuma (JP); Motohide Takeichi, Kanuma (JP); Junji Shinozaki, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/662,947

(22) Filed: Sep. 15, 2000

(30) Foreign Application Priority Data

Sep. 17, 1999 (JP) .......................................... 11-264256

(51) Int. Cl.$^7$ .............................. C08K 3/10; C08L 63/02
(52) U.S. Cl. ....................... 523/440; 523/442; 523/443; 523/444; 523/466; 523/468; 525/504; 525/523; 525/524; 525/903
(58) Field of Search ................................. 523/440, 442, 523/443, 444, 466, 468; 525/504, 523, 524, 903

(56) References Cited

U.S. PATENT DOCUMENTS 6,120,716 A * 9/2000 Kushida ..................... 264/117

FOREIGN PATENT DOCUMENTS

| EP | 0 387 066 A1 | 9/1990 |
| EP | 0 824 270 A2 | 2/1998 |
| EP | 0 893 484 A2 | 1/1999 |
| EP | 0 914 027 A1 | 5/1999 |

\* cited by examiner

*Primary Examiner*—Robert Dawson
*Assistant Examiner*—D. Aylward
(74) *Attorney, Agent, or Firm*—Flynn, Thiel, Boutell & Tanis, P.C.

(57) ABSTRACT

A connecting material for bonding and connecting elements each having electrodes thereon in a correspondingly confronting relation to each other, while attaining electroconductive connection between the corresponding electrodes, which material has a high heat resistance and can avoid occurrence of faulty electrical conductance even in the case of bonding elements having a large number of electrodes arranged, thus, at a considerably small interval under such a condition that the bonded assembly is exposed to a service environment of high temperature or of high temeperature and high humidity, wherein the connecting material contains a thermosetting resin and an inorganic filler and has, after having been cured, characteristic features of a modulus of elasticity of 1–12 GPa, a glass transition temperature Tg of 120–200° C., a coefficient of linear expansion ($\alpha 1$) of 50 ppm/° C. or less at temperatures below the Tg and a coefficient of linear expansion ($\alpha 2$) of 110 ppm/° C. or less at temperatures above the Tg, wherein the difference ($\alpha 2 - \alpha 1$) does not exceed over 60 ppm/° C.

9 Claims, No Drawings

CONNECTING MATERIAL

FIELD OF THE INVENTION

The present invention relates to a connecting material for bonding and connecting elements to be bonded together having a plurality of electrodes opposite to those on the other element, in particular, a connecting material containing a thermosetting resin.

DESCRIPTION OF THE RELATED TECHNIQUES

For assembling a semiconductor, such as an IC, LSI or so on, on a substrate circuit board, a practice has-been employed, in which a semiconductor chip, such as a bear chip, is mounted directly on the substrate circuit board using a connecting material. Here, the bonding of such a chip with the circuit board is performed by holding them in a posture in which the electrodes or terminals disposed on the chip and on the circuit board are in a correspondingly confronting relationship to each other, while interposing the connecting material therebetween, whereupon the connecting material is caused to harden to attain mechanical firm bonding of them and an assured electroconductive connection between the corresponding electrodes simultaneously.

In such a connecting material, a thermosetting resin has been used as the fundamental constituent. The connecting material is interposed between the substrate circuit board and the semiconductor chip and they are held at such a posture that the electrodes or terminals to be electroconductively connected together disposed on them are in a correspondingly opposing relationship to each other, whereupon the resulting assemblage is heat-pressed from both sides by pressing it with heating to cause the thermosetting resin to set to thereby attain a firm bonding of them Here, the mechanical bonding of the chip with the substrate circuit board is established by the bonding strength (adhesive strength) of the resin and the electroconductive connection between the corresponding electrodes or terminals is attained by a pressed friction contact of them secured by the heat setting of the resin. This electroconductive connection between the opposing electrodes may be attained by direct contact of the electrodes with each other or under intermediation by bridging therebetween by electroconductive particles contained in the connecting material in a dispersed state.

The substrate circuit board having assembled thereon semiconductor chip(s) is required to have a heat resistance for withstanding the condition in the step of reflowing of the solder in which the substrate board is exposed to a high temperature. The resulting assembly of the circuit board may be put in service under an environmental condition of relatively high temperature and relatively high humidity, so that it should withstand such a condition. However, the heat resistance and the fastness to environmental condition of conventional connecting materials are not enough and, thus, a problem has been brought about in that occurrence of defective electrical connection in the assembly is sometimes detected not only in the examination tests for the heat resistance and for the fastness to environmental condition, such as heat shock test, pressure cooker test (PCT) and solder-reflowing test, but also in the practical production process steps, when the assembly is exposed to a high temperature. Such a faulty electroconductive connection occurs often in assemblies having semiconductor chips with a narrow-pitched pattern in which a large number of electrodes are arranged within a confirmed region.

Examination of the reason-therefor has reached a discovery that a discrepancy or displacement in the settled positions of the electrodes occurs on connecting two elements with each other, of which coefficients of linear expansion are different from each other, using a connecting material, when the connecting material is brought to a temperature above the glass transition temperature (Tg) of the adhesive resin in the connecting material, as in the case where the material is exposed to such a high temperature as in the reflowing of solder, whereby a faulty electroconductive connection is caused. Here, it is assumed that decrease in the fastness to environmental conditions may be caused by a possible inter layer exfoliation of the bonding layer at the interfaces between the connecting material layer and the elements after a prolonged service, since the internal stresses in the cured layer of the connecting material resulting from the hardening contraction of the adhesive resin, which is large for an adhesive resin exhibiting a high adhesive strength, are concentrated at these interfaces.

SUMMARY OF THE INVENTION

An object of the present invention is to provide a connecting material for bonding and connecting elements having electrodes thereon in a correspondingly confronting relation to each other, while attaining assured electroconductive connection between the corresponding electrodes, which connecting material exhibits a high heat resistance and will not suffer from occurrence of faulty electrical connection, even when the elements have a large number of electrodes arranged at a narrow interval and even if the connecting material is exposed to a condition of a high temperature.

Another object of the present invention is to provide a connecting material for bonding and connecting elements having electrodes thereon in a correspondingly confronting relation to each other, which connecting material exhibits a high heat resistance and a high fastness to environmental-conditions and can maintain a highly reliable electroconductive connection even in services under an environmental condition of high temperature and high relative humidity.

Thus, the present invention resides in the following connection material:

(1) A connecting material (the first connecting material) for bonding and connecting elements having electrodes thereon in a correspondingly confronting relation to each other, comprising
an adhesive component comprising a thermosetting resin and an inorganic filler,
the material having, after having been cured, characteristic features comprising
a modulus of elasticity in the range of 1–12 GPa,
a glass transition temperature (Tg) in the range from 120 to 200° C.,
a coefficient of linear expansion ($\alpha 1$) of 50 ppm/° C. or lower at temperatures below the Tg and
a coefficient of linear expansion ($\alpha 2$) of 110 ppm/° C. or lower at temperatures above the Tg, wherein the difference ($\alpha 2 - \alpha 1$) does not exceed over 60 ppm/° C.

(2) A connecting material (the second connecting material) for bonding and connecting elements having electrodes thereon in a correspondingly confronting relation to each other, comprising
an adhesive component comprising a thermosetting resin and an inorganic filler,
the material having, after having been cured, characteristic features comprising a linear contraction of 0.25% or less and
a coefficient of linear expansion ($\alpha 1$) or 35 ppm/° C. or lower at temperatures below the Tg of the cured material.

(3) The connecting material as defined in the above (2), wherein it has, after having been cured, a moisture absorbability of 2% or lower.

(4) The connecting material as defined in any one of the above (1) to (3), wherein the adhesive component comprises 20–75% by weight of the thermosetting resin, 25–80% by weight of the inorganic filler and 0–40% by weight of a thermoplastic resin.

(5) The connecting material as defined in any one of the above (1) to (4), wherein it further comprises 0–30%, based on the volume of the adhesive component, of electroconductive particles having an average particle size of 1–10 $\mu$m.

DETAILED DESCRIPTION OF THE DISCLOSURE

The first and the second connecting materials according to the present invention are defined using characteristic features of material properties different from each other, while their compositions are defined to be similar, wherein the first connecting material is superior in heat resistance and the second connecting material is excellent both in heat resistance and in fastness to environmental conditions.

For the elements to be bonded together by the connecting material according to the present invention, every pair of elements having, on the face confronting another element, electrodes opposite to corresponding ones on the other element in a pair, in particular, a large number of electrodes to be connected electroconductively with corresponding counter electrodes on the other element may serve for the object of connection. The present invention may particularly be applicable to those in which each of the two elements to be bonded together has electrodes arranged within a confined region with a closer pitch, in a smaller width and at a narrow interval, as in the case of assembling a semiconductor chip, such as a bear chip, on a substrate board. In many cases, a substrate board is used as the counter element for the above-mentioned semiconductor chip to be bonded. The connecting material according to the present invention can be used for assembling semiconductor chips and the like on the substrate board directly or under intermediation with, for example, an interposer. Here, substrate boards made of any voluntary material may be used, for example, glass/epoxy substrate boards, resin boards, glass boards and flexible resin boards.

The connecting material according to the present invention contains an adhesive component comprising a thermosetting resin and an inorganic filler. The connecting material is interposed between the elements to be connected together and the elements are pressed onto each other from both sides so as to cause the electrodes disposed oppositely on the confronting face of each element to be brought into contact with each other, while holding the interspace between neighboring electrodes to be filled with the connecting material. In this state, the connecting material is caused to harden in order to attain electrical connection and mechanical bonding simultaneously. The electrical connection between the opposing electrodes may be realized either by a direct contact of the electrodes or under intermediation by electroconductive particles. If the surface area of a thicker portion of the electrode, such as a stud bump, is small (for example, 1,000 $\mu$m$^2$ or less), direct contact may be permitted, while a contact under intermediation with electroconductive particles is favorable for electrodes with greater surface areas. The electroconductive particles are incorporated in the connecting material in a form so that they are dispersed therein.

As the main resin of the thermosetting resin to be incorporated according to the present invention in the connecting material, any kind of resin capable of being cured by a concurrent use of a hardening agent under the action of heat or irradiation of a ray, such as an UV ray or the like, may be used without any limitation, for example, epoxy resins, phenol resins, hydroxyl group-containing polyester resins, hydroxyl group-containing acrylic resins and so on. Epoxy resins are the most preferable in view of the balance between the participant parameters, such as hardening temperature, hardening time, storage stability and so on of the resin.

As the epoxy resins, those of the bisphenol type, those of the epoxy-novolak type and those obtained from epoxy compounds having two or more oxirane groups in the molecule may be used. Commercial products of these epoxy resins may also be employed as such.

While the main resin of the thermosetting resin of the adhesive component can be subjected to hardening usually by a concurrent use of a hardening agent, it is permissible to dispense with the use of a hardening agent, when a substituent functional group facilitating the hardening reaction is present in the molecule of the main resin. As the hardening agent, there may be used those which can be subject to the hardening reaction with the main resin by the action of heat or irradiation of a ray, for example, imidazoles, amines, acid anhydrides, hydrazides, dicyandiamides and isocyanates as well as modified products of them. Commercial products may also be employed. For such a hardening agent, preference is given to a latent hardening agent.

A latent hardening agent will not be subjected to a curing reaction during processing operations and storage at a normal temperature and upon drying at a relatively lower temperature (40–100° C.) but is subjected to a curing reaction under pressure with heating (heat-pressure) at a curing temperature or by the action of irradiation of a ray, such as an UV ray. For such a latent hardening agent, particular preference is given to one in which the above-mentioned hardening agent, such as an imidazole or an amine, is encapsulated in microcapsules, for which commercial products may also be employed as such. For activation by heating, those having a curing initiation temperature of 80–150° C. may be preferred.

The inorganic filler to be incorporated in the connecting material according to the present invention serves for improving the heat resistance and, in particular, the coefficient of linear expansion of the connecting material by admixing with the adhesive component containing the thermosetting resin. For such an inorganic filler, those which are present as heat-resistant and compression-resistant particulate products having average particle sizes in the range from 0.1 to 15 $\mu$m, preferably from 0.1 to 5 $\mu$m, and Mohs hardnesses in the range from 3 to 9, preferably from 5 to 9, are preferred. Examples of such an inorganic filler include silica, alumina, calcium carbonate and aluminum nitride. Among them, preference is given to silica in view of the ability of tight fitting with organic substances, price and easy availability etc. For practical use, products of crystalline silica, molten silica and synthetic silica may be employed with preference to those having an average particle size of 0.1–5 $\mu$m.

According to the present invention, it is permissible to admix a thermoplastic resin with the adhesive component in order to impart to the connecting material an ability for being coated on substrates or for film forming. For such a thermoplastic resin, there may be used, for example, a phenoxy resin, a polyester resin, an acrylic resin, a polyurethane resin, a butyral resin or a rubbery polymer, such as NBR or SBR.

The adhesive component of the connecting material according to the present invention may further contain other additives, such a surfactants, coupling agents, ion-adsorbents, antioxidants and so on.

The connecting material according to the present invention comprising the adhesive component described above may or may not contain electroconductive particles. Thus, it may contain particles of a metal, such as a solder metal, nickel metal or so on; electrical conductor-coated particles in which core resin particles are coated with an electroconductive material by way of plating or the like; and insulator-coated particles in which these electroconductive particles are coated with an insulating resin. The average particle size of these electroconductive particles may be in the range from 1 to 20 μm, preferably in the range from 2 to 10 μm.

The adhesive component in the first and the second connecting materials according to the present invention comprises, in addition to the thermosetting resin and the inorganic filler, on requirement, other resins and additives. The connecting materials comprise the adhesive component described above and, on requirement, the above-mentioned electroconductive particles.

The first and the second connecting materials according to the present invention are constituted or the adhesive component which may be composed of the thermosetting resin in an amount in the;range from 20 to 75% by weight, preferably in the range from 30 to 70% by weight, the thermoplastic resin in an amount of 0–40% by weight, preferably 0–25% by weight, the inorganic filler in an amount in the range from 25 to 80% by weight, preferably from 30 to 70% by weight, and other additive(s) in an amount of 0–10% by weight, preferably 0–5% by weight, with, if necessary, incorporation of electroconductive particles therein in a proportion of 0–30%, preferably 0–20%, based on the volume of the adhesive component.

The connecting material according to the present invention may be provided as a product in a form of a paste or a sheet.

For preparing a paste of the connecting material, suitable constituent ingredients among those given above may be chosen to form a paste without using any solvent, while, in general, it is practical to form the paste by dissolving or dispersing the constituent ingredients in a suitable solvent. As the solvent, there may be used, for example, alcohols, ketones, esters, ethers, phenols, acetal and nitrogen-containing hydrocarbons, among which toluene, MEK, ethyl acetate and cellosolve acetate may be exemplified. The amount of the solvent to be used may be about 20–40%, based on the weight of the resin components.

For preparing the connecting material in the form of a sheet the above paste of the connecting material is coated on an exfoliative film in a layer, whereupon the solvent of the paste is volatilized to build up a sheet.

The first connecting material according to the present invention should be formulated from the above-given constituent ingredients so that the resulting connecting material after having been cured will have an elastic modulus in the range from 1 to 12 GPa, preferably in the range from 2 to 10 GPa, a glass transition temperature Tg in the range from 120 to 200° C., preferably from 140 to 190° C., a coefficient of linear expansion ($\alpha 1$) at temperatures below the Tg of 50 ppm/° C. or lower, preferably 30 ppm/° C. or lower, and a coefficient of linear expansion ($\alpha 2$) at temperatures above the Tg of 110 ppm/° C. or lower, preferably 100 ppm/° C. or lower, with the difference of ($\alpha 2-\alpha 1$) of 60 ppm/° C. or lower, preferably 50 ppm/° C. or lower, by selecting suitable ingredients and their proportions.

The second connecting material according to the present invention should be formulated from the above-given constituent ingredients so that the resulting connecting material after having been cured will have a linear contraction of 0.25% or lower, preferably 0.22% or lowers and a coefficient of linear expansion ($\alpha 1$) at temperatures below the Tg of the cured connecting material of 35 ppm/° C. or lower, preferably 33 ppm/° C. or lower, by selecting suitable ingredients and their proportions. Here, the second connecting material may favorably have, after having been cured, a moisture absorbability of not higher than 2% by weight, preferably not higher than 1.7% by weight.

The specific procedures for the determination of the above-mentioned characteristic properties are as follows:

○ Elastic modulus is determined by the method according to JIS K-7198.

○ Tg is determined as the temperature at the peak of tan δ on the determination of the elastic modulus.

○ Coefficient of linear expansion was determined by the method according to JIS K-7161.

Linear contraction was determined by the method according to JIS K-6911.

Moisture absorbability was determined by holding the sample at 85° C., at a relative humidity of 85 % for 500 hours and by calculating from the weight difference of the sample observed before and after this treatment.

THE BEST MODE FOR EMBODYING THE INVENTION

The connecting material according to the present invention is interposed between two elements to be connected together, such as a substrate circuit board and a semiconductor chip, each provided on the confronting face with a plurality of electrodes, while holding these elements in a posture in which the electrodes on the confronting face of each of the elements are in a correspondingly confronting relation to each other, whereupon-the elements are heat-pressed by pressing them together from both sides with heating to cause the thermosetting resin to be cured to form a solid assembly. In the case of using a paste of the connecting material, it is coated on one of the elements over a region to be bonded including the electrodes, whereupon the other one of the elements is placed on the so-coated face of the one of the elements before or after drying the coated layer in such a position that the electrodes on both elements are in a correspondingly confronting relation to each other, followed by heat pressing of the assemblage to cause curing of the resin. In the case of using a sheet of the connecting material, it is interposed between the two elements to be connected together, followed by heat pressing of the assemblage to cause curing of the resin. The curing may be realized not only by heating but also by the action of irradiation of a ray, such as an UV ray.

In the connecting procedure described above, by pressing the connecting material interposed between the two elements to be bonded together from both sides onto each other with heating, the connecting material is first melted and expelled from the interspace between the confronting electrodes aside to the free space where no electrode is found, until the confronting electrodes on the elements have been brought into contact with each other so that the confronting electrodes are pressed together to build up an electroconductive frictional contact between them, while the thermosetting resin in the connection material is then cured there to build up the solid assembly. In case electroconductive particles are included, some of these particles will remain in between the confronting electrodes upon the heat pressing and are pressed there by the confronting electrodes to build up a bridge of electroconductive frictional contact between these confronting electrodes. The portion of the connecting material expelled from the interspace between the confronting electrodes aside to the electrode-free space will be cured there to build up a solid fixed bonding between the two elements. In this manner, the electroconductive connection between the confronting electrodes and the mechanical bonding of the two elements are established simultaneously.

In the case of installing a semiconductor chip, as one element to be bonded, on,the substrate circuit board, as the counter element to be bonded, the former may be assembled on the latter by the first connecting material according to the present invention and the resulting assemblage may then be subjected to the so-called solder-reflowing process at a high temperature (for example, 220–270° C.). Here, any faulty electrical connection may not occur, since the first connecting material according tithe present invention has a high heat resistance due to the high elastic modulus and high glass transition temperature Tg together with the lower values of α1 and of α2 and small value of (α2−α1) so that scarce displacement or sliding will result at temperatures above the Tg. When the elements are bonded by the second connecting material according to the present invention, the resulting assembly is superior in fastness to service environments of high temperature and high humidity due to suppression of accumulation of internal stresses, since the linear contraction and the coefficient of linear expansion α1 are low.

During testing for examining the heat resistance by environmental tests, including heat shock tests, PCT and solder-reflowing tests, there occurs also no faulty electrical connection of the electrodes.

As explained above, the first connecting material according to the present invention has a high heat resistance and can bring about a connected assembly which may hardly suffer from occurrence of faulty electrical connection even for elements having a large number of electrodes disposed at a narrow interval and even in an environmental condition of high temperature, because of that, the connecting material comprises an adhesive component comprising a thermosetting resin and an inorganic filler in such a combination and proportion that the elastic modulus, the Tg and the coefficients of linear expansion of the cured connecting material at temperatures below the Tg and at temperatures above the Tg are within a specific range.

The second connecting material according to the present invention is superior in the fastness to environmental conditions of high temperature and high humidity in services, because of that, the connecting material comprises an adhesive component comprising a thermosetting resin and an inorganic filler in such a combination and proportion that the linear contraction and the coefficient of linear expansion at temperatures below the Tg of the cured connecting material are each within a specific range.

EXAMPLES

Below, the present invention will further be described by way of Examples and Comparative Examples.

Examples 1 and 2 and Comparative Examples 1 to 4 for the First Connecting Material Preparation of the First Connecting Material A paste of the connecting material was prepared by kneading an epoxy resin A (a product of Dainippon Ink & Chemicals Inc. with the trade name 4032 D) or an epoxy resin B (a product of the firm Yuka Shell with the trade name Epikote 1009) as the thermosetting resin, a hardening agent based on imidazole (a product of the firm Asashi Ciba with the trade name HX-3941 HP) as the hardening agent, a phenoxy resin (a product of Tohto Kasei Co., Ltd. with the trade name YP 50) as the thermoplastic resin and a commercial silica (a product of the firm Tatsumori with the trade name SOE 2, with an average particle size of 0.5 $\mu$m) as the inorganic filler in a proportion given in Table 1 together with toluene, whereupon the resulting paste was coated on an exfoliative film and the coating layer was dried to obtain a connecting material as a sheet having a thickness of 40 $\mu$m. The so-obtained sheet of connecting material was heated at 200° C. for 5 minutes to cause curing of the material. The properties of the cured connecting material are recited in Table 1.

Material Property Test

For determining the elastic modulus, the exfoliative film having the coated layer of the uncured connecting material-was cut into ribbons of a size of 6 cm×0.2 cm, which were then subjected to curing at 180 ° C. for 5 minutes, whereupon the cured layer of the connecting material,was peeled off from the exfoliative PET film for use as the testing sample sheet. For the testing, VIBRON DDV 01 FP (trade name) of the firm Orientec was used and the determination was carried out at a vibration frequency of 11 Hz, a temperature elevation rate of 3° C. per minute and a chuck-to-chuck distance of 5 cm.

The temperature at the peak of tan $\delta$ in the testing of elastic modulus was determined as the Tg.

The coefficient of linear expansion was determined by the method according to JIS K-7161 for a sample of 15 cm×1 cm×4 $\mu$m at a calibration gauge distance of 10 cm.

Evaluation Test

An IC chip having gold-plated bumps disposed at a pitch of 150 $\mu$m as the electrodes was assembled on a glass/epoxy substrate circuit board having thereon printed copper patterns as the counter electrode in a relation correspondingly confronting those of the bumps using the above connecting material sample sheet. The evaluation of the heat resistance was carried out for the resulting assembly by the following heat shock test and solder-reflowing test. For determination of the electrical resistance, a daisy chain was used. The results are recited in Table 1, wherein OP means that the observed junction resistance was greater than 100 $\Omega$.

In Table 1, "Eval. A" is expressed by the electrical resistance observed through the connected assembly after having been subjected to a heat shock test by repeating heat cycles in which the assembly was maintained at −55° C. and at +125° C. alternatively for each 15 minutes up to 1,000 cycles. "Eval. B" is expressed by the electrical resistance observed through the connected assembly after having been subjected to a solder-reflowing test by heating it under a reflowing condition including the highest reachable temperature of 260° C.

From the results given in Table 1, it is seen that the connected assemblies of Examples 1 and 2 show higher heat resistances, whereas those of Comparative Examples 1 to 4 showed the occurrence of faulty electrical connection, presumably due to the higher coefficients of linear expansion α2 for Comparative Examples 1 and 4, due to the greater values of (α2−α1) for Comparative Example 2 and due to the greater elastic modulus for Comparative Example 3.

TABLE 1

|  | Example | | Comparative Example | | | |
| --- | --- | --- | --- | --- | --- | --- |
|  | 1 | 2 | 1 | 2 | 3 | 4 |
| Adhesive component (wt. part) | | | | | | |
| Epoxy resin A | 45 | 45 | 45 | 45 | 45 | — |
| Epoxy resin B | — | — | — | — | — | 30 |
| Hardening agent | 25 | 25 | 25 | 25 | 25 | 45 |
| Phenoxy resin | 30 | 30 | 30 | 30 | 30 | — |
| Silica [1] | 50 | 70 | 0 | 20 | 85 | 0 |
| Material Property | | | | | | |
| Elastic modulus (GPa) | 6.0 | 9.0 | 1.6 | 3.7 | 13.2 | 2.2 |
| Tg (° C.) | 160 | 160 | 160 | 160 | 160 | 143 |
| α 1 (ppm/° C.) | 33 | 14 | 55 | 45 | 8 | 57 |
| α 2 (ppm/° C.) | 75 | 50 | 130 | 108 | 37 | 160 |
| (α 2 − α 1) (ppm/° C.) | 42 | 36 | 75 | 53 | 29 | 103 |
| Evaluation | | | | | | |
| Init. electrical resist. (Ω) | 32 | 32 | 32 | 32 | 32 | 32 |
| Eval. A: ad 1000 cycle (Ω) | 34 | 34 | OP | 34 | OP | 50 |
| Eval. B: after reflow (Ω) | 34 | 34 | OP | OP | OP | OP |

Note
[1] Percent, based on the weight of the adhesive component.

Examples 3 to 13 and Comparative Example 5 for the Second Connection Material Preparation of the Second Connecting Material A paste of the connecting material was prepared by kneading the epoxy resin A given above or an epoxy resin C (a product of the firm Yuka Shell-Epoxy with trade name EP828) as the thermosetting resin, a hardening agent based on imidazole (a product of the firm Asahi Ciba with the trade name HX-3941 HP) as the hardening agent, a phenoxy resin (a product of Tohto Kasei Co., Ltd. with the trade name YP 50) as the thermoplastic resin, a commercial silica (a product of the firm Tatsumori with the tradename SOE 2, with an average particle size of 0.5 $\mu$m) as the inorganic filler and electrical conductor-coated particles (a product of Nippon Chemical Industrial Co., Ltd. with the trade name 20GNR-4.6EH, with an average particle size of 5 $\mu$m) as the electroconductive particles in a proportion given in Table 2 together with toluene, whereupon the resulting paste was coated on an exfoliative film and the coating layer was dried to obtain a connecting material as a sheet having a thickness of 35 $\mu$m. The properties of the connecting material after having been cured are recited in Table 2.

Material Property Test
Linear Contraction

A sheet sample (thickness 40 $\mu$m) of the dried uncured connecting material removed from the exfoliative film was cut into ribbons of a size of approximately 1 cm×10 cm and the precise length of the resulting ribbon was determined before and after the ribbon was subjected to a heat treatment for heat-setting the thermosetting resin in an oven at 100° C. for one hour and at 150° C. for one additional hour, wherefrom the percent linear contraction of the connecting material was calculated by the equation Linear contraction %=[1−($L_1/L_0$)]×100 in which $L_0$ is the length of the ribbon before the heat setting and $L_1$ is the length thereof after the heat setting.

Coefficient of Linear Expansion

Using a sample in a form of a cylinder with a diameter of 5 mm and a length of 15 mm, which had been cured at 190° C. for one hour, the coefficient of linear expansion of the cured connecting material was calculated from the difference in the expansion between this cured sample and a quartz glass sample of the same size on heating them from room temperature to 200° C.

Moisture Absorbability

A sample in a form of a cylinder with a diameter of 5 mm and a length of 15 mm, which had been cured at 190° C. for one hour, was caused to absorb moisture in an oven under a high temperature and a high relative humidity, whereupon the moisture absorbability (%) was calculated by the following equation.

Moisture absorbability (%)=[1−($W_0/W_1$)]×100 in which $W_0$ is the sample weight before absorption of moisture and $W_1$ is the sample weight after absorption of moisture.

Fast Evaluation Test

An IC chip having metal-plated bumps disposed at a pitch of 150 $\mu$m with a bump surface area of 1,000 $\mu m^2$ and a bump thickness of 20 $\mu$m as the electrodes was assembled on a substrate circuit board having printed pattern of gold-plated copper as the counter electrodes in a relation correspondingly confronting to those of the bumps under intermediation by the above connecting material sample sheet, whereupon the resulting assemblage was heat-pressed at 180° C. at a pressing force of 1.47 N (150 gf) per one bump for 20 seconds. The resulting assembly was examined by the following PCT and heat-shock tests. The results are recited in Table 2.

In Table 2,

"Eval. C" is expressed by the evaluation of electroconductive connection in the connected assembly by a PCT of 300 hours by the evaluation criteria given below under a condition of 121° C., 100% relative humidity and a pressure of 2 atm, after the assembly has twice passed a solder-reflowing test with the highest reachable temperature of 240° C.;

"Eval. D" is expressed by the evaluation of electroconductive connection in the connected assembly by a heat-shock test by the evaluation criteria given below by repeating heat cycles in which the assembly is maintained at −55° C. and at +125° C. alternatively for each 15 minutes up to 1,000 cycles, after the assembly has twice passed a solder-reflowing test with the highest reachable temperature of 240° C.;

"Eval. E" is expressed by the evaluation of electroconductive connection in the connected assembly by a PCT by the evaluation criteria given below under the condition in which the assembly is subjected to absorption of moisture under a condition of 30° C. and 70% relative humidity for 168 hours, followed by a solder-reflowing test with the highest reachable temperature of 240° C. repeated twice and a further PCT under a condition of 121° C., 100% relative humidity and a pressure of 2 atm. for 300 hours; and "Eval. F" is expressed by the evaluation of electroconductive connection in the connected assembly by a heat-shock test by the evaluation criteria given below by repeating-heat cycles in which the assembly is maintained at −55° C. and at +125° C. alternatively for each 15 minutes up to 1,000 cycles, after the assembly has been subjected to absorption of moisture under a condition of 30° C. and 70% relative humidity for 168 hours and, then, passed twice a solder-reflowing test with the highest reachable temperature of 240° C.

Fastness Evaluation Criteria

Grade Criterion

○: All the observed electrical resistances are lower than 1 Ohm.

Δ: The highest observed electrical resistance is not lower than 1 Ohm but lower than 3 Ohms.

X: The highest observed electrical resistance is not lower than 3 Ohms.

From the results given in Table 2, it is seen that the connecting materials in Example 3 to 13 are superior in the heat resistance and fastness, whereas the connecting material of Comparative Example 5 in which the content of inorganic filler is outside the value prescribed by the present invention is inferior in the fastness.

TABLE 2

|  | Example | | | | | | |
|---|---|---|---|---|---|---|---|
|  | 3 | 4 | 5 | 6 | 7 | 8 | 9 |
| Adhesive compound (wt. part) | | | | | | | |
| Epoxy resin C | 48 | 48 | 48 | 48 | 14 | 14 | 14 |
| Epoxy resin A | — | — | — | — | 36 | 36 | 36 |
| Hardening agent | 33 | 33 | 33 | 33 | 33 | 33 | 33 |
| Phenoxy resin | 20 | 20 | 20 | 20 | 20 | 20 | 20 |
| Silica [1] | 30 | 30 | 50 | 50 | 50 | 50 | 55 |
| Electrocond. particles [2] | 0 | 11 | 0 | 12 | 0 | 12 | 12 |
| Material Property | | | | | | | |
| Linear contraction (%) | 0.21 | 0.21 | 0.20 | 0.20 | 0.20 | 0.19 | 0.17 |
| α 1 (ppm/° C.) | 35 | 35 | 30 | 28 | 30 | 28 | 25 |
| Moist absorbability (%) | 1.5 | 1.5 | 1.3 | 1.3 | 1.3 | 1.3 | 1.1 |
| Evaluation | | | | | | | |
| Eval. C | ○ | ○ | ○ | ○ | ○ | ○ | ○ |
| Eval. D | ○ | ○ | ○ | ○ | ○ | ○ | ○ |
| Eval. E | Δ | Δ | Δ | ○ | ○ | ○ | ○ |
| Eval. F | Δ | Δ | Δ | ○ | ○ | ○ | ○ |

|  | Example | | | | Comp. Exam. |
|---|---|---|---|---|---|
|  | 10 | 11 | 12 | 13 | 5 |
| Adhesive compound (wt. part) | | | | | |
| Epoxy resin C | 14 | — | — | — | 48 |
| Epoxy resin A | 36 | 50 | 50 | 50 | — |
| Hardening agent | 33 | 33 | 33 | 33 | 33 |
| Phenoxy resin | 20 | 20 | 20 | 20 | 20 |
| Silica [1] | 60 | 50 | 50 | 60 | 10 |
| Electrocond. particles [2] | 0 | 0 | 12 | 0 | 0 |
| Material Property | | | | | |
| Linear contraction (%) | 0.15 | 0.20 | 0.20 | 0.15 | 0.23 |
| α 1 (ppm/° C.) | 20 | 30 | 29 | 20 | 38 |
| Moist. absorbability (%) | 1.0 | 1.3 | 1.3 | 1.0 | 1.8 |
| Evaluation | | | | | |
| Eval. C | ○ | ○ | ○ | ○ | Δ |
| Eval. D | ○ | ○ | ○ | ○ | Δ |
| Eval. E | ○ | ○ | ○ | ○ | X |
| Eval. F | ○ | ○ | ○ | ○ | X |

Note
[1] Percent. based on the weight of the adhesive component.
[2] Percent. based on the volume of the adhesive component.

What is claimed is:

1. A connecting material for bonding and connecting elements having electrodes thereon in a correspondingly confronting relation to each other, comprising an adhesive component comprising an epoxy resin and silica, the material having, after having been cured, characteristic features comprising a modulus of elasticity in the range of 1–12 GPa, a glass transition temperature (Tg) in the range of 120–200° C., a coefficient of linear expansion (α1) of 50 ppm/° C. or lower at temperatures below Tg and a coefficient of linear expansion (α2) of 110 ppm/° C. or lower at temperatures above Tg, wherein the difference (α2−α1) does not exceed 60 ppm/° C.

2. The connecting material as claimed in claim 1, wherein the adhesive component comprises 20–75% by weight of the epoxy resin, 25–80% by weight of silica and 0–40% by weight of a thermoplastic resin.

3. The connecting material as claimed in claim 2, wherein the thermoplastic resin is a phenoxy resin.

4. The connecting material as claimed in claim 3, wherein it further comprises 0–30%, based on the volume of the adhesive component, of electroconductive articles having an average particle size of 1–10 μm.

5. A connecting material for bonding and connecting elements having electrodes thereon in a correspondingly confronting relation to each other, comprising an adhesive component comprising an epoxy resin and silica, the material having, after having been cured, characteristic features comprising a linear contraction of 0.25% or less and a coefficient of linear expansion (α1) of 35 ppm/° C. or lower at temperatures below the glass transition temperature (Tg) of the cured connecting material.

6. The connecting material as claimed in claim 5, wherein the adhesive component comprises 20–75% by weight of the epoxy resin, 25–80% by weight of silica and 0–40% by weight of a thermoplastic resin.

7. The connecting material as claimed in claim 6, wherein the thermoplastic resin is a phenoxy resin.

8. The connecting material as claimed in claim 7, wherein it further comprises 0–30%, based on the volume of the adhesive component, or electroconductive particles having an average particle size of 1–10 μm.

9. The connecting material as claimed in claim 7, wherein it has, after having been cured, a moisture absorbability of 2% or lower.

* * * * *

UNITED STATES PATENT AND TRADEMARK OFFICE
CERTIFICATE OF CORRECTION

PATENT NO.    : 6,566,422 B1
DATED         : May 20, 2003
INVENTOR(S)   : Hidekazu Yagi et al.

It is certified that error appears in the above-identified patent and that said Letters Patent is hereby corrected as shown below:

Column 12,
Line 38, change "electroconductive articles" to -- electroconductive particles --.

Signed and Sealed this

Fourth Day of November, 2003

JAMES E. ROGAN
*Director of the United States Patent and Trademark Office*